US012801025B2

(12) United States Patent
Baumer et al.

(10) Patent No.: US 12,801,025 B2
(45) Date of Patent: Nov. 17, 2026

(54) ARRANGEMENT, METHOD AND COMPUTER PROGRAM PRODUCT FOR CALIBRATING FACET MIRRORS

(71) Applicant: Carl Zeiss SMT GmbH, Oberkochen (DE)

(72) Inventors: Florian Baumer, Oberkochen (DE); Markus Hauf, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 71 days.

(21) Appl. No.: 18/906,920

(22) Filed: Oct. 4, 2024

(65) Prior Publication Data

US 2025/0028250 A1 Jan. 23, 2025

Related U.S. Application Data

(63) Continuation of application No. PCT/EP2023/058833, filed on Apr. 4, 2023.

(30) Foreign Application Priority Data

Apr. 5, 2022 (DE) ......................... 102022203369.8

(51) Int. Cl.
*G03F 7/00* (2006.01)
*G01J 1/04* (2006.01)
*G01J 1/42* (2006.01)

(52) U.S. Cl.
CPC ........ *G03F 7/70141* (2013.01); *G01J 1/0411* (2013.01); *G01J 1/429* (2013.01);
(Continued)

(58) Field of Classification Search
CPC ............. G03F 7/70141; G03F 7/70033; G03F 7/70075; G03F 7/702; G03F 7/70208;
(Continued)

(56) References Cited

U.S. PATENT DOCUMENTS 6,573,978 B1 6/2003 McGuire, Jr.
8,624,177 B2 * 1/2014 Campion ............... G01D 15/00 250/252.1

(Continued)

FOREIGN PATENT DOCUMENTS

DE 102008009600 A1 8/2009
DE 102012209412 A1 12/2013

(Continued)

OTHER PUBLICATIONS

International Search Report, PCT/EP2023/058833, Jul. 11, 2023, 2 pages.

*Primary Examiner* — Hung V Nguyen
(74) *Attorney, Agent, or Firm* — Edell, Shapiro & Finnan, LLC

(57) ABSTRACT

An arrangement (100), a method and a computer program product for system-integrated calibration of facet mirrors (18, 19) of a microlithographic illumination system (20). Beam paths (103) between a radiation source (101) and a radiation detector (102) are created by the facet mirrors (18, 19), with respectively only one pivotable micromirror (18", 19") of each facet mirror (18, 19) affecting said beam path. By methodically pivoting one of the micromirrors (18", 19") affecting the beam path (10), it is possible, based on the radiation detector (102), to find a specific optimal pivot position, the underlying orientation of the micromirror (18", 19") of which can also be calculated geometrically. By comparing the calculated orientation with the orientation ascertained by a tilt sensor on the micromirror (18", 19"), it is possible to calibrate the tilt sensor or micromirror (18", 19") of the facet mirror (18, 19).

21 Claims, 5 Drawing Sheets

(52) U.S. Cl.
CPC ...... *G03F 7/70033* (2013.01); *G03F 7/70075* (2013.01); *G03F 7/702* (2013.01); *G03F 7/70208* (2013.01); *G03F 7/70516* (2013.01); *G03F 7/70533* (2013.01); *G03F 7/7085* (2013.01)

(58) Field of Classification Search
CPC ............ G03F 7/70516; G03F 7/70533; G03F 7/7085; G03F 7/70116; G01J 1/0411; G01J 1/429; G02B 5/0891; G02B 26/0833
See application file for complete search history.

(56) References Cited

U.S. PATENT DOCUMENTS

| | | | | |
|---|---|---|---|---|
| 9,874,819 | B2 * | 1/2018 | Bieling | G03F 7/70075 |
| 10,444,631 | B2 * | 10/2019 | Deguenther | G03F 7/70116 |
| 10,514,608 | B2 | 12/2019 | Baier et al. | |
| 11,169,445 | B2 | 11/2021 | Bieling et al. | |
| 2006/0132747 | A1 | 6/2006 | Singer et al. | |
| 2013/0100429 | A1 * | 4/2013 | Fiolka | G03F 7/70141 359/850 |
| 2017/0363861 | A1 | 12/2017 | Hauf et al. | |
| 2018/0074303 | A1 | 3/2018 | Schwab | |
| 2018/0246415 | A1 | 8/2018 | Xalter et al. | |

FOREIGN PATENT DOCUMENTS

| | | | |
|---|---|---|---|
| DE | 102016203990 | A1 | 9/2017 |
| DE | 102017220586 | A1 | 5/2019 |
| EP | 1614008 | B1 | 12/2009 |
| WO | 2010008993 | A1 | 1/2010 |

* cited by examiner

ARRANGEMENT, METHOD AND COMPUTER PROGRAM PRODUCT FOR CALIBRATING FACET MIRRORS

CROSS-REFERENCE TO RELATED APPLICATION

This is a Continuation of International Application PCT/EP2023/058833, which has an international filing date of Apr. 4, 2023, and the disclosure of which is incorporated in its entirety into the present Continuation by reference. This Continuation also claims foreign priority under 35 U.S.C. § 119(a)-(d) to and also incorporates by reference, in its entirety, German Patent Applications DE 10 2022 203 369.8 filed on Apr. 5, 2022.

FIELD OF THE INVENTION

The invention relates to an arrangement, a method and a computer program product for system-integrated calibration of the facet mirrors of a microlithographic illumination system.

BACKGROUND

Microlithography is used for producing microstructured component parts, such as for example integrated circuits. The projection exposure apparatus used in the process comprises an illumination system and a projection system. The image of a mask (also referred to as a reticle) illuminated by the illumination system is projected, in a manner to reduce the size thereof, with the projection system onto a substrate, for example a silicon wafer, which is coated with a light-sensitive layer and arranged in the image plane of the projection system, in order to transfer the mask structure to the light-sensitive coating of the substrate.

As a rule, two facet mirrors are arranged in the beam path between the actual radiation source and the mask to be illuminated in the case of illumination systems, in particular of projection exposure apparatuses designed for the extreme ultraviolet (EUV) range, i.e., for exposure wavelengths from 5 nm to 30 nm. These mirrors allow homogenization of the radiation in a manner essentially comparable to the principle of a honeycomb condenser. If the individual facets of the mirrors are formed from electromechanical tiltable micromirrors, suitable control of the micromirrors allows the attainment of virtually any intensity and angle of incidence distribution during the illumination of the mask.

In order to attain the required precision when setting a desired intensity and angle of incidence distribution, it is necessary to be able to accurately set the orientation of the individual micromirrors. In this case, the micromirrors also comprise a tilt sensor with which the orientation of the micromirror can be read and verified in two spatial directions, in addition to the micro-electromechanical drive required for pivoting the mirror.

The relationship between the actual orientation of the micromirror and the value ascertained with the tilt sensor is typically non-linear and requires a calibration, the calibration resulting in a sensor characteristic that only in fact renders the values ascertained by the tilt sensor usable for controlling the micromirrors. An accuracy of the order of 10 μrad is required for application in microlithography.

It was found that the sensor characteristics of the tilt sensors are subject to a drift and possibly other similar transformations as well, with the result that the accuracy of the orientations of the micromirrors ascertained with the tilt sensors reduces over time, whereby the precision of the intensity and angle of incidence distributions settings may also reduce.

Thus, continuous operation of an illumination system comprising corresponding facet mirrors with electromechanically tiltable micromirrors requires a regular recalibration. However, known calibration methods which require opening of the illumination system and/or the application of an external sensor measurement system are complicated and time consuming.

One object of the invention is to develop an arrangement, a method and a computer program product for system-integrated calibration of the facet mirrors of a microlithographic illumination system, with which the recalibration in question can be carried out in system-integrated fashion.

SUMMARY

This and other objects are addressed or achieved by an arrangement, a method, and a computer program product as claimed in the independent claims. Advantageous developments are the subject of the dependent claims.

Accordingly, the invention relates to an arrangement for system-integrated calibration of the facet mirrors of a microlithographic illumination system, wherein the facet mirrors are each designed as a micro-electromechanical system with a multiplicity of individually pivotable micromirrors with in each case a tilt sensor for ascertaining the orientation of the micromirror and are each arranged stationarily in the beam path of the illumination optical unit of the illumination system, wherein at least one electromagnetic radiation-emitting radiation source and at least one radiation detector suitable for detecting the radiation originating from the radiation source are arranged stationarily such that suitable pivoting of the micromirrors of the facet mirrors yields a beam path from a radiation source to a radiation detector, with in each case only one micromirror of each facet mirror affecting this beam path.

The invention also relates to a method for calibrating the facet mirrors of the microlithographic illumination system using an arrangement according to the invention, including:

a) initially pivoting at least one micromirror of one of the facet mirrors such that a beam path from a radiation source to a radiation detector is made possible, with only one micromirror per facet mirror affecting this beam path;
b) methodically pivoting one of the micromirrors affecting the beam path, at least over the pivot range in which the beam path is incident on the beam detector and detected by the beam detector;
c) ascertaining the optimal pivot position of the methodically pivoted micromirror with the aid of the beam detector, in the case of which position the beam path is incident as centrally as possible on the micromirror that follows the methodically pivoted micromirror along the beam path or on the beam detector;
d) determining the orientation of the methodically pivoted micromirror, as ascertained by the tilt sensor of the micromirror, for the ascertained optimal pivot position;
e) comparing the orientation ascertained by the tilt sensor of the methodically pivoted micromirror with an orientation calculated from the geometric arrangement of radiation source, the micromirrors affecting the beam path and the radiation detector; and
f) recalibrating the tilt sensor of the micromirror on the basis of the carried-out comparison.

Finally, the invention also relates to a computer program product or set of computer program products comprising program parts which, when loaded onto a computer or networked computers connected to an arrangement according to the invention, are designed to carry out the method according to the invention.

Firstly, some terms used in the context of the invention are explained:

The term "micromirrors" primarily and preferably relates to small, in particular rectangular mirrors with an edge length of up to 1 mm×1 mm, 1.5 mm×1.5 mm or 2 mm×2 mm. Provided there is no stipulation in relation to these micromirrors in the narrow sense of the word, it is however also possible, in principle, for facet mirrors with a hexagonal mirror surface and/or with a diameter of up to 5 mm or 10 mm to be comprised by the term micromirror.

In addition to the tilt sensors, the "micro-electromechanical system" (MEMS) also comprises actuators, with which the micromirrors of a facet mirror can be individually pivoted. Particularly in the case of relatively small micromirrors, for example with an edge length of up to 1.5 mm×1.5 mm, the micro-electromechanical system can be realized using microsystem technology. In the case of larger micromirrors, for example with a diameter of up to 10 mm, the micro-electromechanical system may also comprise a miniaturized conventional mechanism, for example made of copper.

A "calibration" denotes the adaptation of a given transfer function of a first measured value to a measured variable which reflects a second measurable value. Thus, in the case of a tilt sensor of a micromirror, one or more analogue electrical or digitized signals are converted into one or more angle specifications, for example, with the aid of a transfer function adapted by the calibration, these angle specifications reflecting the orientation of the micromirror vis-à-vis a defined zero orientation. Depending on the transfer function and, in particular, depending on the number of changeable parameters, it is advantageous to carry out a plurality of measurements of the first value for different second values for the purpose of a complete calibration in order to enable a sufficient number of support points for a complete adaptation of the transfer function or all of its parameters. Here, it is the fundamental target of a calibration to adapt the transfer function sufficiently exactly so that the measured variable ascertained from the first measured value corresponds as accurately as possible to the actual second value without the second value itself needing to be measured. As a rule, there even is a specification for the accuracy to be obtained with the aid of the calibration, which accuracy should be attained over the entire value range or a specified portion of the value range of the first measured value.

Before the actual calibration is carried out in order to attain the specified accuracy, either a certain "basic calibration" (which optionally still needs to be verified or can be verified) is assumed or a basic calibration is carried out. There is also an adaptable transfer function, as is also adapted during the actual calibration, in a "basic calibration"; the transfer functions of the basic calibration and the actual calibration are often even identical. However, a transfer function with a basic calibration has, as a rule, an accuracy that is orders of magnitude lower than that of the subsequently completely calibrated transfer function. Nevertheless, it is helpful as a starting point for the actual calibration since the basic calibration is usually at least in the vicinity of the ultimate calibration, hence allowing the effort for the actual calibration to be lower.

The invention has recognized that it is possible to calibrate, in particular recalibrate, the facet mirrors of the illumination system in system-integrated fashion, that is to say for example it is possible to improve the accuracy of a sensor characteristic of individual micromirrors of the facet mirrors which is available in principle but possibly no longer accurate on account of drift, with only minimal changes, if required at all, to known illumination systems—in the extreme case, merely by the provision of a single stationary radiation detector. To this end, no moving parts, in particular, need to be provided in addition to the facet mirrors to be calibrated.

The invention exploits the highly accurate stationary arrangement of the generally two facet mirrors required for illumination in the field of microlithography, the geometry of which facet mirrors is moreover likewise known, in order to generate a beam path from a stationary radiation source to a likewise stationary radiation detector with suitable adjustments to the facet mirrors, with in each case only a single micromirror of each facet mirror affecting this beam path. Conversely, if such a beam path exists, radiation of the radiation source possibly incident on the other micromirrors of the facet mirrors is not deflected onto the radiation detector in any case. This can be ensured by suitable pivoting of the micromirrors, either by using available calibrations of the micromirrors, even if these are possibly no longer highly accurate, or by pivoting into a suitable end position of the micro-electromechanical system.

For a beam path as provided for according to the invention, it is possible on the one hand to mathematically ascertain the optimal orientation of the affecting micromirrors. On the other hand, the pivot range of a micromirror can be "scanned" by methodically pivoting the micromirror affecting the beam path and observing the signal of the radiation detector until, for example, the greatest possible intensity sets in on the radiation detector or the micromirror that follows the methodically pivoted micromirror along the beam path or the radiation detector is struck as centrally as possible. By comparing the orientation of the micromirror ascertained thus with the mathematically ascertained optimal orientation, it is possible to calibrate the tilt sensor, at least for this specific orientation.

The radiation detector can be an intensity detector, that is to say a detector which can be used to measure the intensity of the radiation in a wavelength range acquirable by the detector that is incident over the entire detector surface. A stop, preferably an aperture stop, can be provided for clearly delimiting the detector surface relevant to the intensity measurement. If the diameter or the aperture of the stop has been adapted to the diameter or the shape of the beam path in the region of the radiation detector, the absolute maximum of the measured intensity generally corresponds to the central incidence of the beam path on the stop or the radiation detector.

Alternatively or additionally, the radiation detector can be provided with a narrow bandwidth wavelength filter that has been adapted to the wavelength of the radiation source. This can reduce a possible falsification of the measurement result of the radiation detector by stray radiation that does not originate from the radiation source, for example stray radiation emanating from the exposure radiation source of the illumination system.

The at least one radiation source can be one or more radiation sources specifically provided for the arrangement. However, the one or more radiation sources can also be the exposure radiation source of the illumination system, i.e., the radiation source utilized for illuminating the mask and the projection thereof onto a substrate with a projection system. The micromirrors affecting the desired radiation path then merely need to be aligned so that the beam path does not end on a mask but in the radiation detector as a matter of principle. In particular, the exposure radiation source can be a UV or an EUV exposure radiation source in a wavelength range from 190 nm to 400 nm and from 5 nm to 30 nm, respectively.

It is preferable for at least one radiation source to emit light in the visible range (whereby it is regularly not the exposure radiation source). Instead, the radiation source can for example comprise a high power light-emitting diode, for example with a light output in the wavelength range from 400 nm to 500 nm and a radiant flux from 500 mW to 1.5 W in the case of a luminous area ranging from 0.5 mm×0.5 mm to 2 mm×2 mm, or comprise a laser as actual light source which in this case is preferably arranged in fibre-coupled fashion and at a distance from the actual location of the radiation source, so that the radiation source or the light exit opening of the coupled fibre can be arranged in space-saving fashion in the interior of the illumination system and as little heat as possible is introduced into the illumination system.

It is preferable for at least one radiation source and/or at least one radiation detector to be arranged in each case in the vicinity of the reticle or object plane or intermediate focus of the exposure radiation source of the illumination system. In particular, the radiation source and/or the radiation detector may in this case be arranged away from the various possible beam paths for the illumination of the mask such that the original functionality of the illumination system is not impaired by these additional components of the arrangement. Arranging a radiation detector in the vicinity of the object plane lends itself to the case where the exposure radiation source of the illumination system is utilized as a radiation source of the arrangement.

It is preferable for the micromirrors of the facet mirrors to each be pivotable about two non-parallel axes-preferably perpendicular axes-such that the normal vector of the mirror can sweep over a 2-D angular space, generally in conical or pyramidal fashion. Corresponding micromirrors permit great variability in the intensity distribution when illuminating the mask.

Further details in relation to the arrangement according to the invention also emerge from the following explanations in relation to a method according to the invention, this method relating to the system-integrated calibration of the facet mirrors of a microlithographic illumination system rendered possible by an arrangement according to the invention.

In a first step of the exemplary method according to the invention, at least one micromirror of one of the facet mirrors is pivoted to enable a beam path from a radiation source to a radiation detector, with only one micromirror per facet mirror—and hence especially also the micromirror methodically pivoted in the subsequent step, in addition to the at least one initially pivoted micromirror—affecting this beam path.

Even if the assumption of a certain basic calibration of the micromirrors may already render it sufficient for the purpose of establishing the ultimately desired beam path to only initially pivot those micromirrors which are subsequently not methodically pivoted, it is preferable to initially pivot all micromirrors affecting the desired beam path—i.e., also the micromirror to be subsequently pivoted methodically—in order then to verify the beam path by emitting radiation from the radiation source and testing for a detector signal at the radiation detector. By way of example, the presence of a detector signal or of a given intensity, for example at least 10% of the intensity expected in the case of an optimal calibration, may be required after the initial pivoting so that a sufficiently accurate basic calibration can be assumed. This can ensure the presence of a certain basic calibration of the micromirrors.

If a basic calibration cannot be assumed or cannot be verified, as explained above, it is possible for the lack of a detector signal after the initial pivoting of all micromirrors affecting the envisaged beam path to be followed by methodical pivoting of these micromirrors according to a given search pattern until radiation emanating from the radiation source, preferably above a given minimum intensity, can be detected by the radiation detector. It is thereby 7435 possible to bring about a basic calibration for the micromirrors affecting the beam path. In particular, the micromirrors subsequently not pivoted methodically can be kept in their orientation found in this way.

In principle, how the remaining micromirrors of the facet mirrors that do not affect the desired beam path are aligned is irrelevant to the method according to the invention, as long as it is ensured that there is no further beam path to the one radiation detector which could be detected by the radiation detector. In particular, the micromirrors not affecting the desired beam path can be used in parallel to calibrate a certain micromirror for an exposure of a microlithographic mask.

Initial pivoting is followed by methodical pivoting of one of the micromirrors affecting the beam path. Thus—depending on the configuration of the initial pivoting—the micromirror to be pivoted methodically is an initially pivoted micromirror or the one micromirror which was initially not pivoted but which, in principle, affects the desired beam path. Methodical pivoting comprises such pivoting of the micromirror in question that the pivoting range of the micromirror is at least traversed over the range in which the desired beam path is in fact incident on and can be detected by the beam detector—and in which it is not interrupted by virtue of, for example, the beam path actually emanating from the methodically pivoted micromirror not being incident on the next micromirror arranged along the desired beam path or not being incident on the beam detector. Incidentally, pivoting the micromirror in a certain direction starting from an orientation in which the beam detector detects a beam path can always be terminated whenever the radiation detector is no longer able to detect any radiation from the radiation source.

In this case, methodical pivoting is always implemented over all axes about which the micromirror is pivotable. By way of appropriate pivoting, it is in principle possible to detect the pivoting range in which the desired beam path exists or does not exist as a matter of principle, specifically if the beam path emanating from the methodically pivoted micromirror is not incident on the subsequent micromirror along the beam path or the radiation detector.

The use of the data of the radiation detector read during the methodical pivoting is not limited to determining the pivoting range in which the desired beam path is present as a matter of principle. Rather, it is also possible to determine the optimal pivot position of the methodically pivoted micromirror, in the case of which the beam path is incident as centrally as possible on the subsequent micromirror along the beam path or on the beam detector. If the micromirror to be adjusted methodically is followed by a further micromirror, the outline thereof acts as a stop since only the radiation incident within the outline is reflected; by contrast, if this is followed immediately by the beam detector, only the radiation incident on the actually active area of the detector, which is optionally delimited by a stop, is registered. In both cases, the intensity of the beam path emanating from the methodically pivoted micromirror is highest for an incidence which is as central as possible on the subsequent micromirror along the beam path or on the radiation detector.

If the radiation detector is an intensity detector, the intensity of the radiation incident thereon can be used directly to ascertain the optimal pivot position of the methodically pivoted micromirror. In particular, the maximum of the intensity ascertained by the radiation detector, especially in the case of a maximum intensity plateau the central maximum of the intensity ascertained by the radiation detector, the slopes of increase and decrease in intensity when pivoting the micromirror to be pivoted methodically and/or the centroid of the measured profile can be used to this end. It is also possible for the radiation detector to comprise a two-dimensional CCD array sensor or an active pixel sensor. Using an appropriate sensor, the two-dimensional property of the active sensor surface may optionally also allow the center of the maximum intensity on the sensor area and hence the point of incidence of the beam path to be ascertained in addition to the intensity of the radiation incident on this sensor, which possibly further increases the accuracy of the calibration if the arrangement of the sensor is accurately known.

However, it is also possible to ascertain the optimal pivot position on the basis of the pivot range over which radiation is even incident on the radiation detector, if a constant pivoting speed of the methodically pivoted micromirror and/or an unchanging (mis-)calibration over the entire pivot range is assumed. If the contour of the pivot range in question is ascertained, the optimal pivot position can be ascertained geometrically. In this case, it is sufficient for the radiation detector to be a binary detector which merely specifies whether or not radiation is incident thereon.

Following the ascertainment of the optimal pivot range, it is possible to determine which orientation of the micromirror for the pivot position ascertained as optimal is ascertained by the tilt sensor of the micromirror. In this case, it is possible as a matter of principle to pivot the micromirror into the pivot position ascertained as optimal and then read the orientation ascertained by the tilt sensor. However, it is preferable for the orientation ascertained by the tilt sensor to be recorded in addition to the signal of the radiation detector during the methodical pivoting of the micromirror. Once the optimal pivot position has been ascertained, the fitting orientation as ascertained by the tilt sensor can be read directly from the recorded data.

On account of the highly precise arrangement and configuration of the facet mirrors as is required for the field of microlithography, it is possible to calculate the orientation corresponding to the optimal pivot position for the methodically pivoted micromirror from the geometric arrangement of radiation source, micromirrors affecting the beam path and radiation detector. By comparing this calculated orientation of the micromirror with the orientation ascertained for the optimal pivot position with the tilt sensor, it is possible to determine whether the current calibration of the tilt sensor still is correct or whether there are deviations between the calculated value and the orientation ascertained by the tilt sensor which necessitate a recalibration.

In this case, the procedure from methodically pivoting the micromirror (step b) to comparing the orientation ascertained by the tilt sensor with the calculated orientation (step e) can be carried out simultaneously for all axes about which the micromirror can be pivoted. However, it is also possible for the method steps in question to be carried out separately, in particular immediately successively, for each of these axes.

If described steps a) to e) from initially pivoting micromirrors for enabling a specific beam path to comparing the orientation ascertained by the tilt sensor with the calculated orientation for an individual beam path are carried out, the calibration of the micromirror can be verified for a specific pivot position of the micromirror. However, on account of the non-linear relationship between the signal of the tilt sensor and the orientation of the micromirror in particular, it is preferable if steps a) to e) for a micromirror to be pivoted methodically are carried out with at least three, preferably with at least five, further preferably with at least nine different beam paths. In this case, the remaining micromirrors used to establish the various beam paths affected in each case by the same micromirror to be pivoted methodically are preferably not located on a common straight line in the plane of the respective facet mirrors but have a two-dimensional distribution. In the case of three different beam paths, the initially adjusted micromirrors of a facet mirror for the different beam paths may be arranged for example in the form of a right-angled triangle; in the case of five beam paths, the comparable micromirrors may be arranged in the form of a cross in particular; in the case of nine or more beam paths, an arrangement in the form of a two-dimensional grid is preferable. However, for a reliable and accurate calibration of a micromirror, steps a) to e) may also be carried out with 10, 20 or 100 different beam paths.

If a comparison according to step e) has been carried out for all the beam paths provided for a micromirror to be adjusted methodically, the data from the at least one comparison can be used to recalibrate the tilt sensor of the micromirror. In other words, the sensor characteristic of the tilt sensor is adjusted so that the values ascertained by the tilt sensor of a micromirror correspond as exactly as possible, but with an accuracy of at least 10 μrad in particular, to the actual orientation of the respective micromirror.

During this recalibration, it is possible in particular to adjust an n-dimensional characteristic of the tilt sensor, where n corresponds to the number of axes about which the associated micromirror can be pivoted. Depending on the shape of this n-dimensional characteristic, steps a) to e) should be carried out with a sufficient number of different beam paths to obtain suitably many support points for the recalibration or adjustment of the characteristic.

Using the method according to the invention, it is possible as a matter of principle to calibrate both the micromirrors of a facet mirror closer to the radiation source and the micromirrors of a facet mirror closer to the radiation detector using a specific pair of radiation source and radiation detector. However, within the scope of calibrating micromirrors on the facet mirrors with the aid of a fixed pair of one radiation source and one radiation detector, it is preferable for the micromirrors of the facet mirror closer to the radiation source along the radiation path to be calibrated first. As a result, it is frequently possible to attain a higher accuracy of the calibration of the micromirrors of a facet mirror closer to the radiation detector.

As already indicated, the method according to the invention or the arrangement according to the invention in principle allows a calibration of individual micromirrors in parallel with a microlithographic exposure with the aid of the remaining micromirrors of the facet mirrors. In view of the regularly large number of micromirrors and the regularly required time for the calibration of an individual micromirror, it is even preferable to carry out the calibration in parallel with actual exposures in order to keep downtimes of the illumination system, and hence downtimes of an entire microlithographic projection exposure apparatus, on account of a calibration as low as possible.

In order to keep any conceivable mutual interference of exposure and calibration as small as possible, it is preferable for the radiation source(s) deviating from the exposure radiation source of the illumination system to be spectrally and/or temporally decoupled from the exposure by the exposure radiation source. If radiation sources that deviate from the exposure radiation source are used, suitable choice of the radiation source can ensure that the calibration radiation source emits no radiation in the wavelength range relevant to the exposure. As a result of this and the possible provision of a suitable wavelength filter at the radiation detector, it is also possible to at least reduce an interference with the calibration on account of the radiation emanating from the exposure radiation source.

Moreover, the exposure radiation sources used in microlithography are regularly operated in pulsed fashion. Therefore, it is possible to operate the radiation source(s) provided for calibration purposes only whenever the exposure radiation sources do not emit any radiation. In other words, a radiation source provided for the calibration can be operated in inverse-pulsed fashion vis-à-vis the exposure radiation source.

The arrangement according to the invention preferably comprises a control device designed to carry out the method according to the invention. In particular, this can be an already existing control device of an illumination system designed according to the invention or a control device of the microlithographic projection exposure apparatus, in which the illumination system is embedded.

The computer program product according to the invention comprises program parts which, when loaded in an appropriate control device, are designed to carry out the method according to the invention. This is particularly relevant to the microlithographic projection exposure apparatuses which, for other reasons, have an arrangement comparable with the arrangement according to the invention and therefore require no further structural modifications for the purpose of carrying out the method according to the invention.

BRIEF DESCRIPTION OF THE DRAWINGS

Now, the invention is described in exemplary fashion on the basis of advantageous embodiments, with reference being made to the attached drawings, in which.

DETAILED DESCRIPTION

Figure 1:
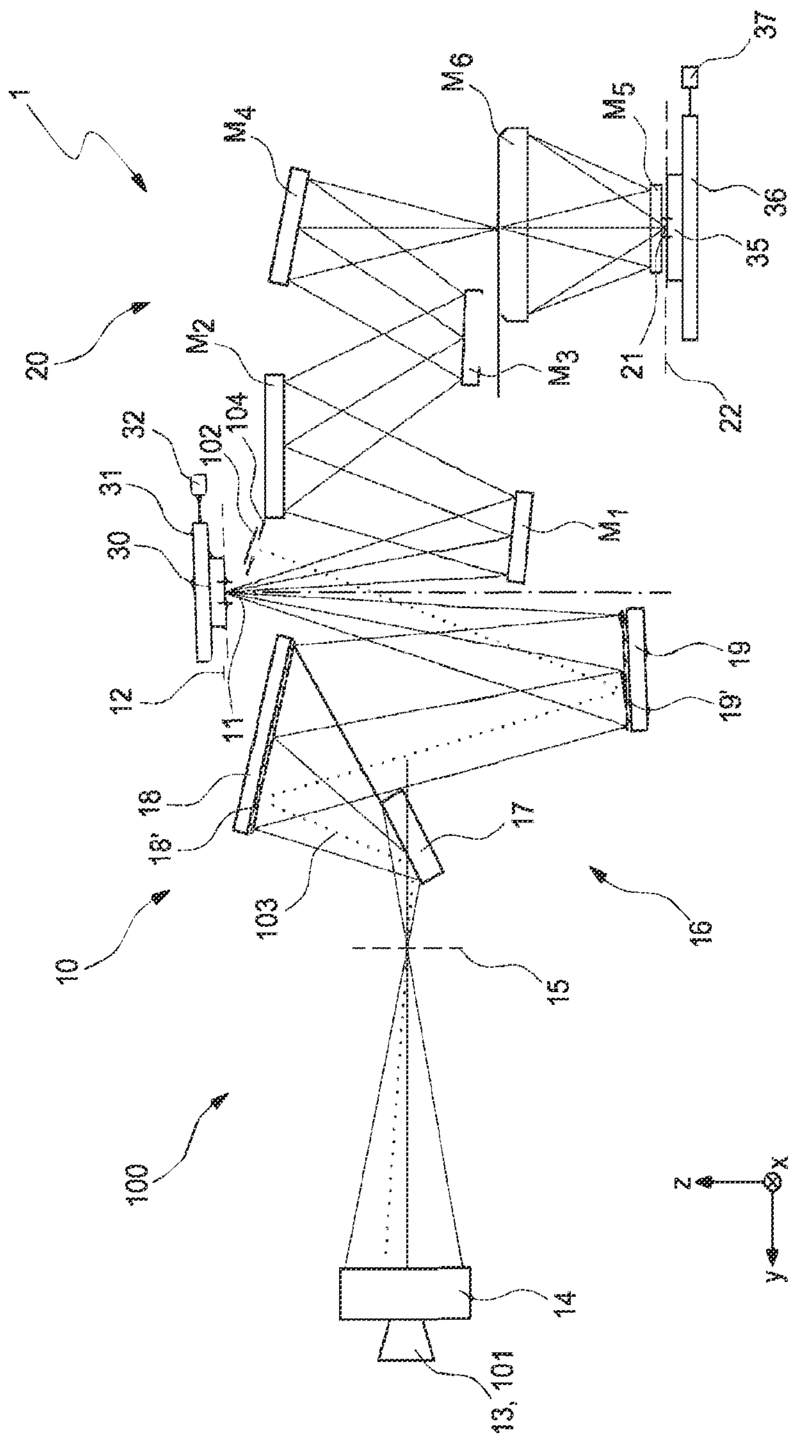
FIG. 1: shows a schematic illustration of a microlithographic projection exposure apparatus comprising an arrangement according to the invention.

FIG. 1 shows a schematic meridional section of a microlithographic projection exposure apparatus 1. In this case, the projection exposure apparatus 1 comprises an illumination system 10 and a projection system 20, with the illumination system 10 being developed with an arrangement 100 according to the invention.

An object field 11 in an object plane 12 is illuminated with the aid of the illumination system 10.

To this end, the illumination system 10 comprises an exposure radiation source 13 which, in the illustrated exemplary embodiment, emits illumination radiation at least comprising used light in the EUV range, that is to say with a wavelength of between 5 nm and 30 nm in particular. The exposure radiation source 13 can be a plasma source, for example an LPP (laser produced plasma) source or a GDPP (gas discharge produced plasma) source. It may also be a synchrotron-based radiation source. The exposure radiation source 13 can also be a free electron laser (FEL).

The illumination radiation emanating from the exposure radiation source 13 is initially focused in a collector 14. The collector 14 can be a collector with one or with a plurality of ellipsoidal and/or hyperboloidal reflection surfaces. The illumination radiation can be incident on the at least one reflection surface of the collector 14 with grazing incidence (GI), that is to say at angles of incidence of greater than 45°, or with normal incidence (NI), that is to say at angles of incidence of less than 45°. The collector 14 can be structured and/or coated on the one hand for optimizing its reflectivity for the used radiation and on the other hand for suppressing extraneous light.

The illumination radiation propagates through an intermediate focus in an intermediate focal plane 15 downstream of the collector 14. Should the illumination system 10 be constructed in a modular fashion, the intermediate focal plane 15 can be used as a matter of principle for the separation—even the structural separation—of the illumination system 10 into a radiation source module, comprising the exposure radiation source 13 and the collector 14, and the illumination optical unit 16 described below. In the case of a corresponding separation, radiation source module and illumination optical unit 16 then jointly form a modularly constructed illumination system 10.

The illumination optical unit 16 comprises a deflection mirror 17. The deflection mirror 17 can be a plane deflection mirror or, alternatively, a mirror with a beam-influencing effect that goes beyond the purely deflecting effect. Alternatively or additionally, the deflection mirror 15 can be embodied as a spectral filter separating a used light wavelength of the illumination radiation from extraneous light having a wavelength that deviates therefrom.

The deflection mirror 17 is used to deflect the radiation emanating from the exposure radiation source 13 to a first facet mirror 18. If—as in the present case—the first facet mirror 18 is arranged in a plane of the illumination optical unit 16 which is optically conjugate to the object plane 12 as a field plane, this facet mirror is also referred to as a field facet mirror.

The first facet mirror 18 comprises a multiplicity of micromirrors 18' that are individually pivotable about two perpendicular axes in each case, for the purpose of controllably forming facets which are each equipped with a tilt sensor (not depicted here) for ascertaining the orientation of the micromirror 18'. Thus, the first facet mirror 18 is a micro-electromechanical system (MEMS system), as for example also described in DE 10 2008 009 600 A1.

A second facet mirror 19 is arranged downstream of the first facet mirror 18 in the beam path of the illumination optical unit 16, with the result that this yields a doubly faceted system, the fundamental principle of which is also referred to as a fly's eye integrator. If the second facet mirror 19—like in the depicted exemplary embodiment—is arranged in a pupil plane of the illumination optical unit 16, it is also referred to as a pupil facet mirror. However, the second facet mirror 19 may also be arranged at a distance from a pupil plane of the illumination optical unit 4, as a result of which a specular reflector arises from the combination of the first and the second facet mirror 18, 19, for example as described in US 2006/0132747 A1, EP 1 614 008 B1 and U.S. Pat. No. 6,573,978.

The second facet mirror 19, too, comprises a multiplicity of micromirrors 19' that are individually pivotable about two perpendicular axes in each case and are each equipped with a tilt sensor (not depicted here) for ascertaining the orientation of the micromirror 19'. For further explanations, reference is made to DE 10 2008 009 600 A1.

The individual facets of the first facet mirror 18 are imaged into the object field 11 with the aid of the second facet mirror 19, with this regularly only being approximate imaging. The second facet mirror 19 is the last beam-shaping mirror or actually the last mirror for the illumination radiation in the beam path upstream of the object field 11.

In each case one of the facets of the second facet mirror 19 is assigned to exactly one of the facets of the first facet mirror 18 for the purpose of forming an illumination channel for illuminating the object field 11. This may in particular produce illumination according to the Köhler principle.

The facets of the first facet mirror 18 are imaged overlaid on one another with a respective assigned facet of the second facet mirror 19, for the purposes of fully illuminating the object field 11. Here, the full illumination of the object field 11 is as homogeneous as possible. It preferably has a uniformity error of less than 2%. The field uniformity can be achieved through the overlay of different illumination channels.

By selecting the ultimately used illumination channels, which is possible without problems with a suitable adjustment of the micromirrors 18', 19', it is still possible to adjust the intensity distribution in the entrance pupil of the projection system 20 described below. This intensity distribution is also referred to as illumination setting. Incidentally, it may be advantageous here to arrange the second facet mirror 19 not exactly in a plane that is optically conjugate to a pupil plane of the projection system 20. In particular, the pupil facet mirror 19 can be arranged so as to be tilted relative to a pupil plane of the projection system 20, as is described in DE 10 2017 220 586 A1, for example.

In the arrangement of the components of the illumination optical unit 16 shown in FIG. 1, however, the second facet mirror 19 is arranged in an area conjugate to the entrance pupil of the projection system 20. Reflection mirror 17 and the two facet mirrors 18, 19 are arranged tilted both vis-à-vis the object plane 12 and vis-à-vis one another in each case.

In an alternative embodiment (not depicted here) of the illumination optical unit 16, a transfer optical unit comprising one or more mirrors may additionally be provided in the beam path between the second facet mirror 19 and the object field 11. The transfer optical unit may in particular comprise one or two normal-incidence mirrors (NI mirrors) and/or one or two grazing-incidence mirrors (GI mirrors). Using an additional transfer optical unit, it is possible in particular to take account of different poses of the entrance pupil for the tangential and for the sagittal beam path of the projection system 20 described below.

Alternatively, the deflection mirror 17 depicted in FIG. 1 may be dispensed with, for which purpose then the facet mirrors 18, 19 should be suitably arranged vis-à-vis the radiation source 13 and the collector 14.

The object field 11 in the object plane 12 is transferred onto the image field 21 in the image plane 22 with the aid of the projection system 20.

To this end, the projection system 20 comprises a plurality of mirrors $M_i$, which are consecutively numbered in accordance with their arrangement in the beam path of the projection exposure apparatus 1.

In the example depicted in FIG. 1, the projection system 20 comprises six mirrors $M_1$ to $M_6$. Alternatives with four, eight, ten, twelve or any other number of mirrors $M_i$ are likewise possible. The penultimate mirror $M_5$ and the last mirror $M_6$ each have a passage opening for the illumination radiation, as a result of which the depicted projection system 20 is a doubly obscured optical unit. The projection system 20 has an image-side numerical aperture that is greater than 0.3 and may also be greater than 0.6, and may be for example 0.7 or 0.75.

The reflection surfaces of the mirrors $M_i$ may be in the form of freeform surfaces without an axis of rotational symmetry. However, the reflection surfaces of the mirrors $M_i$ can alternatively also be designed as aspherical surfaces with exactly one axis of rotational symmetry of the reflection surface shape. Just like the mirrors of the illumination optical unit 16, the mirrors $M_i$ can have highly reflective coatings for the illumination radiation. These coatings can be designed as multilayer coatings, in particular with alternating layers of molybdenum and silicon.

The projection system 20 has a large object-image offset in the y-direction between a y-coordinate of a center of the object field 11 and a y-coordinate of the center of the image field 21. This object-image offset in the y-direction can be of approximately the same magnitude as a z-distance between the object plane 21 and the image plane 22.

In particular, the projection system 20 can be designed to be anamorphic, that is to say it has a different imaging scales $\beta_x$, $\beta_y$ in the x- and y-directions in particular. The two imaging scales $\beta_x$, $\beta_y$ of the projection system 20 are preferably $(\beta_x, \beta_y)$=(+/−0.25, /+−0.125). An imaging scale β of 0.25 corresponds here to a reduction with a ratio of 4:1, while an imaging scale β of 0.125 results in a reduction with a ratio of 8:1. A positive sign in the case of the imaging ratio β means imaging without image inversion; a negative sign means imaging with image inversion.

Other imaging scales are likewise possible. Other imaging scales $\beta_x$, $\beta_y$ with the same sign and the same absolute magnitude in the x- and y-directions are also possible.

The number of intermediate image planes in the x-direction and in the y-direction in the beam path between the object field 11 and the image field 21 can be the same or different, depending on the embodiment of the projection system 20. Examples of projection systems 20 with different numbers of such intermediate images in the x-direction and y-direction are known from US 2018/0074303 A1.

In particular, the projection system 20 can comprise a homocentric entrance pupil, which can be accessible or be inaccessible.

A mask 30 (also referred to as reticle) arranged in the object field 11 is exposed by the illumination system 10 and transferred by the projection system 20 onto the image plane 21. The mask 30 is held by a reticle holder 31. The reticle holder 31 is displaceable by a reticle displacement drive 32, in particular in a scanning direction.

A structure on the mask 30 is imaged onto a light-sensitive layer of a wafer 35 arranged in the region of the image field 21 in the image plane 22. The wafer 35 is held by a wafer holder 36. The wafer holder 36 is displaceable with a wafer displacement drive 37, in particular in the y-direction. The displacement on the one hand of the mask 30 with the reticle displacement drive 32 and on the other hand of the wafer 35 with the wafer displacement drive 37 may take place so as to be synchronized with one another.

The projection exposure apparatus 1 depicted in FIG. 1 or the illumination system 20 thereof, the above description of which substantially reflects the known prior art, is developed using an arrangement 100 according to the invention.

In principle, the arrangement 100 comprises a radiation source 101 that emits electromagnetic radiation, with the exposure radiation source 13 of the illumination system 10 being used as radiation source 101 in the exemplary embodiment depicted in FIG. 1, with the result that it is possible to dispense with a separately embodied radiation source.

Further, the arrangement comprises a radiation detector 102, which is stationarily arranged in the vicinity of the object plane 12 of the illumination system 10 so that a suitable adjustment of the micromirrors 18', 19' of the two facet mirrors 18, 19 of the illumination system 10 yields a beam path 103 from the radiation source 101 to the radiation detector 102, with in each case only one micromirror 18', 19' from each of the two facet mirrors 18, 19 affecting this beam path. The radiation detector 102 is an intensity detector which is provided with a bandpass filter (not depicted here) adapted to the wavelength of the beam source 101—i.e., EUV in particular. Moreover, the radiation detector 102 is equipped with a stop 104 which is used to delimit the active area of the radiation detector 102.

The use of this arrangement 100 for system-integrated calibration of the facet mirrors 18, 19 of the illumination system 10—and hence the method according to the invention—is now explained on the basis of FIGS. 2A-4.

Figure 2B:
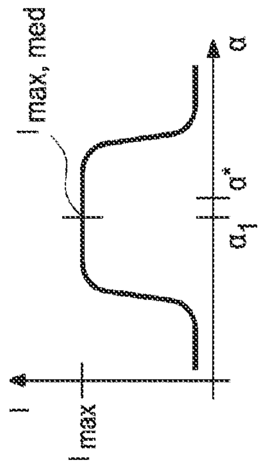
FIG. 2B shows an associated intensity distribution used in the calibration.
Figure 2A:
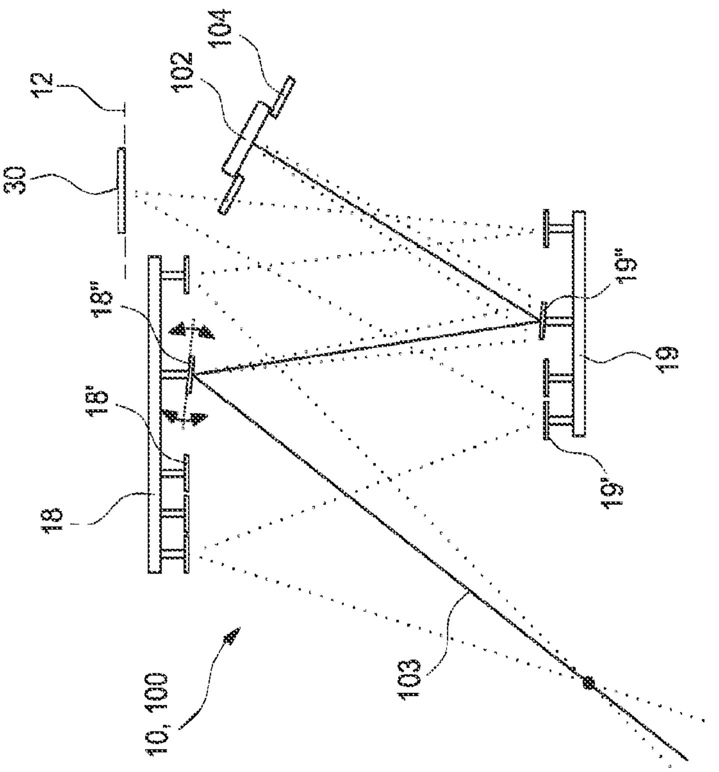
FIG. 2A: shows a schematic illustration of the calibration of a micromirror of a first facet mirror of the projection exposure apparatus of FIG. 1.
Figure 3B:
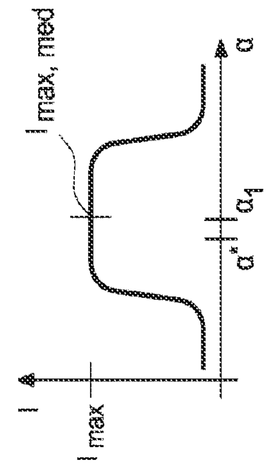
FIG. 3B shows an associated intensity distribution used in the calibration.
Figure 3A:
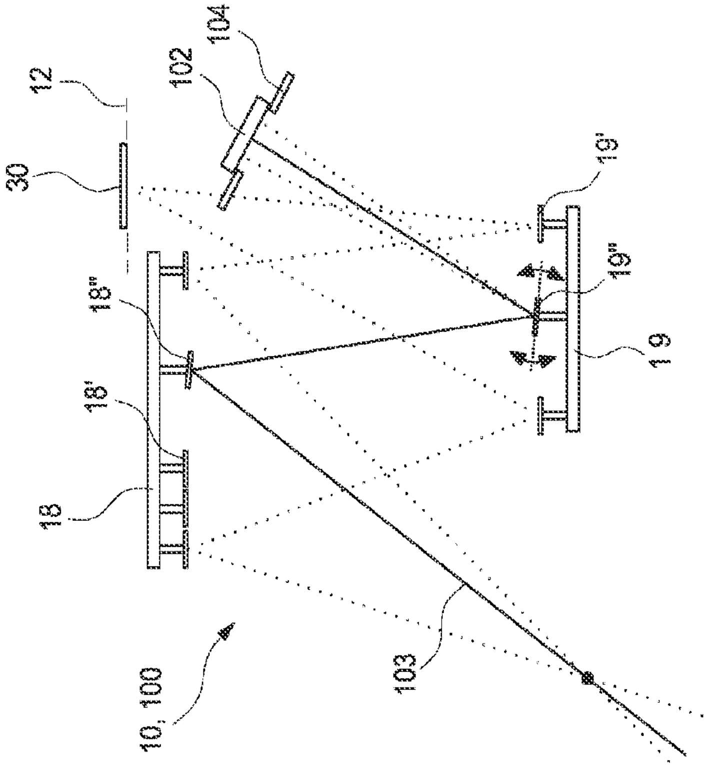
FIG. 3A: shows a schematic illustration of the calibration of a micromirror of a second facet mirror of the projection exposure apparatus of FIG. 1.
Figure 4:
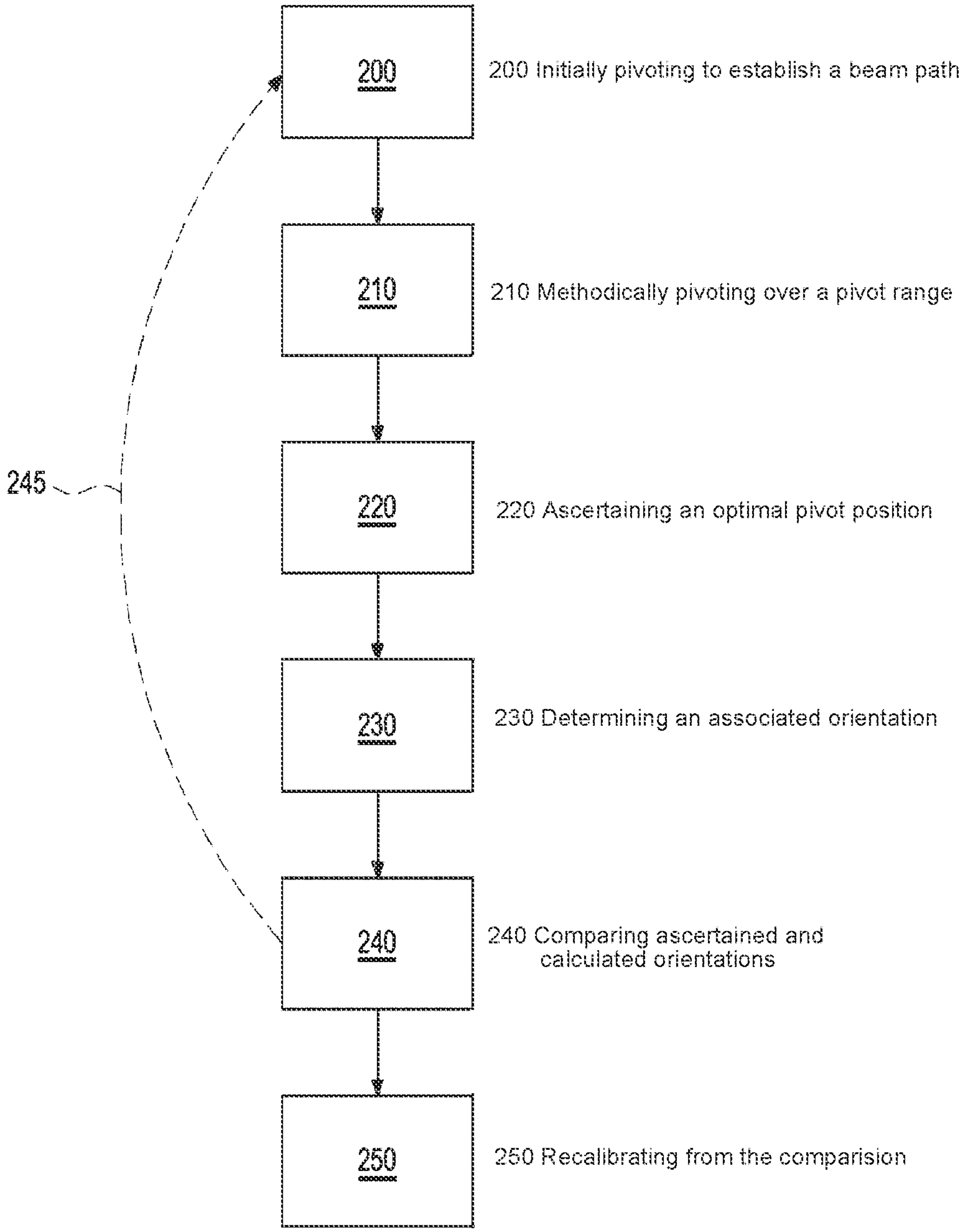
FIG. 4: shows a schematic flow chart of the method according to the invention.

FIGS. 2A and 3A each show a schematic portion of the illumination optical unit 16 of FIG. 1 which is relevant to the arrangement 100 and the use thereof, comprising the two facet mirrors 18, 19 (with individual micromirrors 18', 19' of the two facet mirrors 18, 19 being depicted in exemplary fashion) and the mask 30 located in the object plane 12. The radiation detector 102 of the arrangement 100 is also depicted. FIG. 4 schematically shows an exemplary procedure of a method according to the invention.

In principle, the micromirrors 18', 19' are suitably aligned for the exposure of the mask 30 in accordance with a desired intensity distribution, as is sufficiently well known from the prior art. However, one micromirror 18", 19" on each of the two facet mirrors 18, 19 is aligned deviating therefrom, such that this yields a beam path 103 from the radiation source 101 (cf. FIG. 1) to the radiation detector 103 via precisely these two micromirrors 18", 19". Since the remaining micromirrors 18', 19' are suitably aligned for exposure purposes, it is ensured that only this beam path 103 is in fact incident on the radiation detector 102.

Provision is made for the two micromirrors 18", 19" to be initially pivoted into the orientation required to establish the desired beam path 103 (cf. FIG. 4, step 200). To this end, it is possible to resort to the calibration of the micromirrors 18", 19" existing in principle, that is to say it is possible to set an angle specification for each of the two axes about which the micromirrors 18", 19" are pivotable, under monitoring by the tilt sensors of the micromirrors 18", 19". As a rule, despite a possible sensor drift of the tilt sensor, an existing calibration still is sufficiently accurate to be able to set up the beam path 103 as a matter of principle, and this can also be verified by determining radiation from the radiation source 101 being incident on the radiation detector 102. Should a corresponding verification fail, attempts should be made to methodically pivot, according to a given search pattern, the micromirrors 18", 19" affecting the envisaged beam path 103 until radiation emanating from the radiation source 101 can be determined by the radiation detector 102.

Proceeding from the initial orientation obtained by the initial pivoting of the two micromirrors 18", 19", one of the two micromirrors 18", 19" affecting the beam path 103 is methodically pivoted—this is the micromirror 18" in FIG. 2A and the micromirror 19" in FIG. 3A (cf. FIG. 4, step 210).

In this case, the micromirrors 18", 19" are each pivoted methodically over the entire pivot range in which the beam path 103 is incident on and detected by the radiation detector 102. In particular, the detection is no longer the case when pivoting the micromirror 18" if the part of the beam path 103 emanating from the micromirror 18" is no longer incident on the micromirror 19" (cf. FIG. 2A); in this case, the outline of the micromirror 19" acts like a stop for the beam path 103. Something comparable happens when pivoting the micromirror 19": The part of the beam path 103 emanating therefrom is incident on the stop 104 depending on the orientation of the micromirror 19" and can then no longer be detected by the radiation detector 102.

FIGS. 2B and 3B each plot the intensity I of the incident radiation detected by the radiation detector 102 against the pivot angle $\alpha$ recorded by the tilt sensor of the respective methodically pivoted micromirror 18" (FIG. 2B) or 19" (FIG. 3B). In this case, the representation in FIGS. 2A-3B is restricted in each case to pivoting on a pivot axis of the micromirrors 18", 19" perpendicular to the plane of the sheet. If, as in the present case, the micromirrors 18", 19" are pivotable about two axes, the methodical pivoting should also be carried out over each of the axes, it being possible to consider the two axes simultaneously or successively with a temporal offset.

From the data recorded thus, it is possible to ascertain the optimal pivot position of the methodically pivoted micromirror 18" (FIG. 2B) or 19" (FIG. 3B) (cf. FIG. 4, step 220), for which optimal pivot position the part of the beam path 103 emanating from the micromirror 18" is incident as centrally as possible on the micromirror 19" or the part of the beam path 103 emanating from the micromirror 19" is incident as centrally as possible on the radiation detector 102: This is because the optimal pivot position corresponds to the central maximum of the intensity $I_{max, med}$.

For the optimal pivot position $I_{max, med}$ ascertained thus, it is possible in each case to ascertain from the recorded data the associated pivot angle $\alpha_1$ detected by the tilt sensor of the respective micromirror 18", 19" or the orientation of the methodically pivoted micromirror 18" or 19" ascertained by the respective tilt sensor (cf. FIG. 4, step 230).

On account of the precise knowledge of the arrangement of radiation source 101, the facet mirrors 18, 19 or the micromirrors 18", 19" and radiation detector 102, it is also possible to calculate that orientation of the methodically pivoted micromirror 18", 19" which should correspond to the optimal pivot position. This calculated orientation also yields the pivot angle $\alpha^*$ which the tilt sensor should have actually specified for the optimal pivot position of the methodically pivoted micromirror 18" or 19". $\beta_y$ comparing the pivot angle $\alpha_1$ detected by the tilt sensor for the optimal pivot position with the pivot angle $\alpha^*$ calculated for this pivot position (cf. FIG. 4, step 240), it is already possible as a matter of principle to adapt the calibration of the tilt sensor for this one pivot position on the basis of the comparison (cf. FIG. 4, step 250).

However, for a specific micromirror 18" or 19" to be pivoted methodically, provision is made for the above-described steps 200-240 to be carried out for a total of five different beam paths 103 (cf. FIG. 4, arrow 245). The five micromirrors 19' or 18' which are on the facet mirror 19, 18 that does not comprise the micromirror 18", 19" to be pivoted methodically but which each affect one of the five beam paths 103 are preferably arranged here in the form of a cross on the respective facet mirror 19, 18, that is to say three of the micromirrors 19', 18' are in each case located on a common straight line, with the respective middle micromirror 19', 18' thereof being located on both mutually perpendicular straight lines.

This yields a total of five of the above-described comparisons of detected and calculated orientations or pivot angles $\alpha_1$, $\alpha^*$ for the respective optimal pivot positions of the micromirror 18" or 19" to be pivoted methodically, in each case for one beam path 103 (cf. FIG. 4, step 240), and these can be used to recalibrate the tilt sensor of the micromirror 18" or 19" (cf. FIG. 4, step 250).

This is helpful, in particular for tilt sensors which have a possibly non-linear, two-dimensional characteristic on account of pivotability about two separate axes since the five support points arising from the aforementioned five comparisons are generally enough to adapt the two-dimensional characteristic of the tilt sensor over the aforementioned pivot range, and thus achieve a complete recalibration of the tilt sensor. Depending on the characteristic of the tilt sensor or the required accuracy of the calibration, however, it is naturally also possible that significantly more beam paths and resultant comparisons are required to carry out a suitable calibration.

As is apparent from FIGS. 2A-3B, micromirrors 18', 19' of both the first and the second facet mirror 18, 19 can be calibrated by a defined pair of radiation source 101 and radiation detector 102. In this case, it is advantageous if the calibration of individual micromirrors 19' of the second facet mirror 19 is carried out only with the aid of micromirrors 18' of the first facet mirror 18 that were already previously calibrated in accordance with the invention. In other words, the micromirrors of the facet mirror 18 closer to the radiation source 103 along the radiation path 103 should be calibrated first.

Figure 5B:
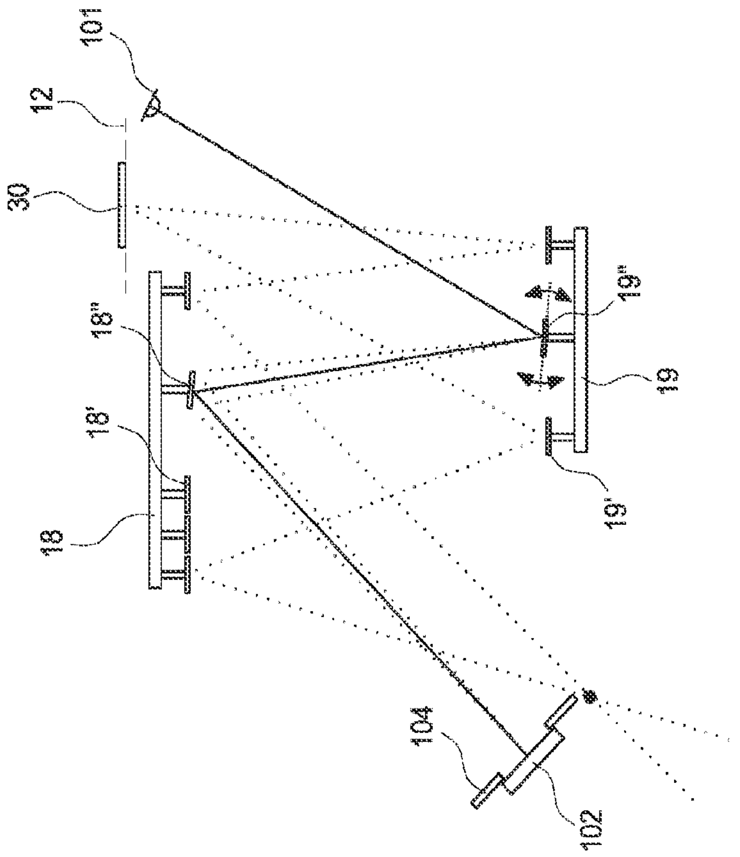
FIGS. 5A, B: show schematic illustrations of alternative embodiments of the projection exposure apparatus of FIG. 1 using an additional radiation source in the vicinity of an intermediate focus (FIG. 5A) or in the vicinity of an object plane (FIG. 5B).
Figure 5A:
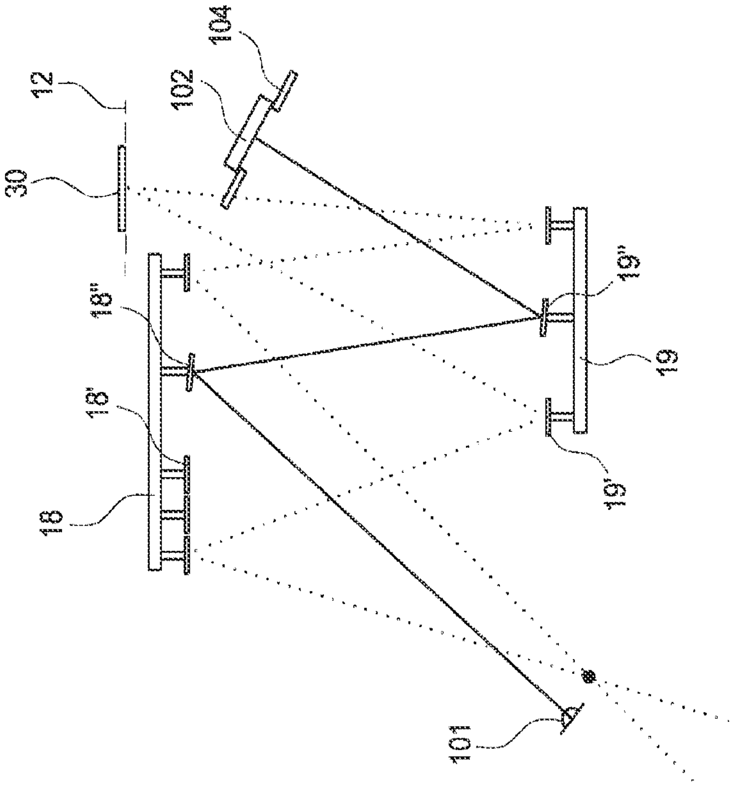

FIGS. 5A and 5B depict alternative embodiments of the arrangement 100 according to FIGS. 1 to 3A. In this case, the illustration of FIGS. 5A and 5B is restricted to the relevant schematic portion of the illumination optical unit 16, already known from FIGS. 2A and 3A, of a projection exposure apparatus 1 according or comparable to FIG. 1.

The arrangements 100 according to FIGS. 5A and 5B are distinguished in that, instead of using the exposure radiation source 13 as a radiation source 101, provision is made of a separate radiation source 101 for the creation of the desired beam paths 103, this separate radiation source emitting light in the visible range. The radiation sources 101 in FIGS. 5A and 5B each comprise a high power light-emitting diode.

In FIG. 5A, the radiation source 101 is arranged in the vicinity of the intermediate focus of the exposure radiation source 13 of the illumination system 10, whereby the radiation detector 102 continues to remain arranged in the vicinity of the object plane 22. In the embodiment variant according to FIG. 5B, the positions of the radiation source 101 and of the radiation detector have been interchanged in comparison with FIG. 5A.

The calibration of the individual micromirrors 18', 19' of the facet mirrors 18, 19 of the illumination system 10 can be implemented in a manner analogous to the procedure described in the context of FIGS. 1 to 3A, and so reference is made to the explanations given there.

In order to avoid any conceivable interference with the actual exposure procedure by a calibration using a separate radiation source 101, the radiation source 101 is only used temporally decoupled from the exposure radiation source 13, that is to say the radiation source 101 only emits radiation when the exposure radiation source 13 does not emit radiation. Since the exposure radiation source 13 is regularly operated to emit high frequency pulses, the radiation source 101 can also be operated to emit high frequency pulses, and so in terms of the calibration procedure there is hardly any difference with a permanently operated radiation source 101.

Naturally, the provision of a plurality of radiation sources 101 and radiation detectors 102 is possible in order to be able to calibrate a plurality of micromirrors 18', 19' in parallel—also parallel in time with an exposure-resulting in less time being required for a complete calibration of all micromirrors 18', 19' from both facet mirrors 18, 19.

What is claimed is:

1. Arrangement for system-integrated calibration of tilt sensors of facet mirrors of a microlithographic illumination system, comprising:

at least one electromagnetic radiation-emitting radiation source and at least one radiation detector configured to detect the radiation emitted from the radiation source, wherein the facet mirrors are each configured as a microelectromechanical system with a plurality of individually pivotable micromirrors with respective tilt sensors for ascertaining respective orientations of the micromirrors, wherein each of the micromirrors is arranged stationarily in a beam path of an illumination optical unit of the illumination system, wherein the electromagnetic radiation-emitting radiation source and the radiation detector are arranged stationarily such that a pivoting of the micromirrors of the facet mirrors yields a beam path from the radiation source to the radiation detector, involving only one micromirror of the micromirrors of each of the facet mirrors.

2. Arrangement according to claim 1, wherein the radiation detector is an intensity.

3. Arrangement according to claim 2, wherein the intensity detector comprises a stop and/or a bandpass filter adapted to the wavelength of the radiation source.

4. Arrangement according to claim 1, wherein the radiation source is an exposure radiation source of the illumination system and/or at least one radiation source that emits visible-range light.

5. Arrangement according to claim 4, wherein the radiation source is an extreme ultraviolet (EUV) exposure radiation source and/or at least one high power light-emitting diode or a laser that emits the light in the visible range.

6. Arrangement according to claim 1, wherein the at least one radiation source and/or the at least one radiation detector are in each case arranged near an object plane of the illumination system or an intermediate focus of the exposure radiation source of the illumination system.

7. Arrangement according to claim 1, wherein the micromirrors of the facet mirrors are each pivotable about two non-parallel axes.

8. Method for calibrating the facet mirrors of a microlithographic illumination system using the arrangement according to claim 1, comprising:

a) initially pivoting at least one of the micromirrors of one of the facet mirrors such that a beam path from the radiation source to the radiation detector is established, with only one micromirror per facet mirror affecting the beam path;

b) methodically pivoting one of the micromirrors affecting the beam path at least over the pivot range in which the beam path is incident on and detected by the beam detector;

c) ascertaining an optimal pivot position of the methodically pivoted micromirror with the beam detector in which position the beam path is incident most centrally on the micromirror that follows the methodically pivoted micromirror along the beam path or on the beam detector;

d) determining an orientation of the methodically pivoted micromirror, as ascertained by a tilt sensor of the micromirror, for the ascertained optimal pivot position;

e) comparing the orientation ascertained by the tilt sensor of the methodically pivoted micromirror with an orientation calculated from the geometric arrangement of the radiation source, the micromirrors affecting the beam path and the radiation detector; and f) recalibrating the tilt sensor of the micromirror based on the carried-out comparison.

9. Method according to claim 8, wherein said initial pivoting of the micromirrors of the facet mirrors affecting the beam path is followed by verifying the beam path desired by testing for a detector signal of the radiation detector, with the micromirrors affecting the provided beam path until radiation emanating from the radiation source is determined by the radiation detector.

10. Method according to claim 9, wherein said verifying comprises methodically pivoting the micromirrors affecting the provided beam path according to a given search pattern in the absence of a detector signal until radiation emanating from the radiation source above a given minimum intensity is determined by the radiation detector.

11. Method according to claim 8, wherein said ascertaining of the optimal pivot position comprises ascertaining a maximum of the intensity ascertained by the radiation detector, ascertaining the central maximum of the intensity ascertained by the radiation detector and/or ascertaining slopes of increase and decrease of the intensity when pivoting the one micromirror.

12. Method according to claim 8, wherein said ascertaining and said determining are carried out separately for each pivot axis of the micromirror being pivoted methodically.

13. Method according to claim 12, wherein said ascertaining and said determining are carried out immediately successively for each pivot axis of the micromirror being pivoted methodically.

14. Method according to claim 8, further comprising carrying out said initially pivoting, said methodically pivoting, said ascertaining, said determining and said comparing for a selected micromirror of the facet mirror being pivoted methodically, with at least three different beam paths.

15. Method according to claim 14, wherein the selected initially pivoted micromirrors are not located on a straight line.

16. Method according to claim 1, wherein an n-dimensional characteristic of the tilt sensor is adapted for recalibrating the tilt sensor, where n equals the number of axes about which the micromirror associated with the tilt sensor is pivoted.

17. Method according to claim 8, wherein, when micromirrors on the facet mirrors are calibrated with a defined pair of the radiation source and the radiation detector, the micromirrors of the facet mirror closer to the radiation source along the radiation path are calibrated first.

18. Method according to claim 8, wherein the calibration of individual ones of the micromirrors is implemented in parallel with a microlithographic exposure carried out with remaining ones of the micromirrors of the facet mirrors.

19. Method according to claim 8, further comprising spectrally and/or temporally decoupling given ones of at least one radiation that deviate from the exposure radiation source of the illumination system from the exposure by the exposure radiation source.

20. Arrangement comprising a non-transitory control device programmed to carry out the method as claimed in claim 8.

21. A tangible, non-transitory computer program product comprising program parts which, when loaded onto a computer or networked computers are programmed to carry out the method according to claim 8.

* * * * *